(12) United States Patent
Semple et al.

(10) Patent No.: US 6,218,701 B1
(45) Date of Patent: Apr. 17, 2001

(54) POWER MOS DEVICE WITH INCREASED CHANNEL WIDTH AND PROCESS FOR FORMING SAME

(75) Inventors: Dexter Elson Semple, Wilkes Barre; Jun Zeng, Mountaintop, both of PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/303,270

(22) Filed: Apr. 30, 1999

(51) Int. Cl.$^7$ .................................................. H01L 29/76
(52) U.S. Cl. .................. 257/342; 257/287; 257/286; 257/618; 257/623; 257/95; 438/147
(58) Field of Search .................... 257/287, 342, 257/286, 618, 623, 95; 438/147

(56) References Cited

U.S. PATENT DOCUMENTS

| | | | |
|---|---|---|---|
| 4,748,103 | * | 5/1988 | Hollinger .............................. 430/314 |
| 4,985,740 | * | 1/1991 | Shenai et al. ........................ 357/23.4 |
| 4,998,151 | * | 3/1991 | Korman et al. ...................... 357/23.4 |
| 5,019,522 | * | 5/1991 | Meyer et al. .......................... 437/29 |
| 5,119,153 | * | 6/1992 | Korman et al. ...................... 357/23.4 |
| 5,430,315 | * | 7/1995 | Rumennik ............................ 257/331 |
| 5,541,430 | * | 7/1996 | Terashima ............................ 257/342 |
| 5,897,343 | * | 4/1999 | Mathew et al. ...................... 438/133 |
| 5,977,564 | * | 11/1999 | Kobayashi et al. ..................... 257/77 |

* cited by examiner

Primary Examiner—Eddie C. Lee
Assistant Examiner—Eugene Lee
(74) Attorney, Agent, or Firm—Jaeckle Fleischmann & Mugel, LLP

(57) ABSTRACT

A power MOS device that has increased channel width comprises a semiconductor substrate and a doped upper layer of a first conduction type disposed on the substrate. The upper layer comprises a plurality of doped well regions of a second, opposite conduction type and a plurality of heavily doped source regions of the first conduction type at an etched upper surface of the upper layer that comprises parallel corrugations disposed transversely to the source regions. A gate that separates one source region from another comprises an insulating layer and a conductive material. The corrugations provide an increase in width of a channel underlying the gate and the well and source regions. In a process for forming a power MOS device with increased channel width on a semiconductor substrate having a doped upper layer of a first conduction type, a stripe mask is formed on an upper surface of the upper layer, and the upper surface is selectively etched to form a corrugated surface comprising a plurality of parallel corrugations. Following removal of the stripe mask, an insulating layer is formed on the corrugated surface, and an overlying conductive layer is formed on the insulating layer, the insulating and conductive layers comprising a corrugated gate region disposed transversely to the parallel corrugations of the upper surface. A dopant of a second, opposite conduction type is implanted to form a doped well region in the upper layer, and a dopant of the first conduction type is implanted into a portion of the corrugated surface adjacent to the gate, thereby forming a heavily doped source region in the upper layer. In an alternative procedure for forming a gate, a gate trench having a floor comprising parallel corrugations that substantially correspond to the corrugations in the upper surface is etched into the upper layer. Following lining of the trench floor and sidewalls with an insulating layer, the trench is substantially filled with a conductive material to form a gate trench. A dopant of the first conduction type is implanted into a portion of the corrugated surface adjacent to the gate region, thereby forming a heavily doped source region in the upper layer.

10 Claims, 4 Drawing Sheets

POWER MOS DEVICE WITH INCREASED CHANNEL WIDTH AND PROCESS FOR FORMING SAME

FIELD OF THE INVENTION

The present invention relates to semiconductor devices and, more particularly, to a power MOS device having increased channel width and to a process for forming same.

BACKGROUND OF THE INVENTION

The recent proliferation of portable, battery-powered electronic communication devices has increased the need for low voltage, low on-resistance power MOSFETs for efficient power management. For low voltage MOSFETs, the channel resistance is a large component of the overall on-resistance. Therefore lowering the channel resistance results in a corresponding reduction in on-resistance.

FIG. 1 schematically depicts a prior art device 100 having a planar DMOS stripe configuration on a substrate 101 having a doped upper layer 102. Upper layer 102 includes doped P-well regions 103 and heavily doped N+ source regions 104. On an upper surface 105 of upper layer 102 is a gate region 106 that includes an insulating layer 107 and a conductive layer 108.

One means for reducing channel resistance in a prior art device such as 100 is to increase its channel density in the region 109 of layer 102 underlying gate region 106. Increasing channel density, however, would require a reduction in device geometry and/or a process modification that may be subject to equipment and technique limitations. The present invention offers a desirable alternative to the increased channel density approach for achieving reduced on-resistance in a power device.

SUMMARY OF THE INVENTION

The present invention is directed to a power MOS device that has increased channel width and comprises a semiconductor substrate and a doped upper layer of a first conduction type disposed on the substrate. The upper layer comprises a plurality of doped well regions of a second, opposite conduction type and a plurality of heavily doped source regions of the first conduction type at an etched upper surface of the upper layer that comprises parallel corrugations disposed transversely to the source regions. A gate that separates one source region from another comprises an insulating layer and a conductive material. The corrugations provide an increase in width of a channel underlying the gate.

Further in accordance with the present invention is a process for forming a power MOS device having increased channel width on a semiconductor substrate having a doped upper layer of a first conduction type. A stripe mask is formed on an upper surface of the upper layer, and the upper surface is selectively etched to form a corrugated surface comprising a plurality of parallel corrugations. Following removal of the stripe mask, an insulating layer is formed on the corrugated surface, and an overlying conductive layer is formed on the insulating layer, the insulating and conductive layers comprising a corrugated gate region disposed transversely to the parallel corrugations of the upper surface. A dopant of a second, opposite conduction type is implanted to form a doped well region in the upper layer, and a dopant of the first conduction type is implanted into a portion of the corrugated surface adjacent to the gate, thereby forming a heavily doped source region in the upper layer.

In an alternative procedure for forming a gate, a gate trench having a floor comprising parallel corrugations that substantially correspond to the corrugations in the upper surface is etched into the upper layer. Following lining of the trench floor and sidewalls with an insulating layer, the trench is substantially filled with a conductive material to form a gate trench. A dopant of the first conduction type is implanted into a portion of the corrugated surface adjacent to the gate region, thereby forming a heavily doped source region in the upper layer.

The present invention provides a means of increasing channel width in a power MOS device without requiring reduced device geometry. The increased width of the channel is a consequence of the corrugated surface of its overlying gate region.

DETAILED DESCRIPTION OF THE INVENTION

Figure 1:
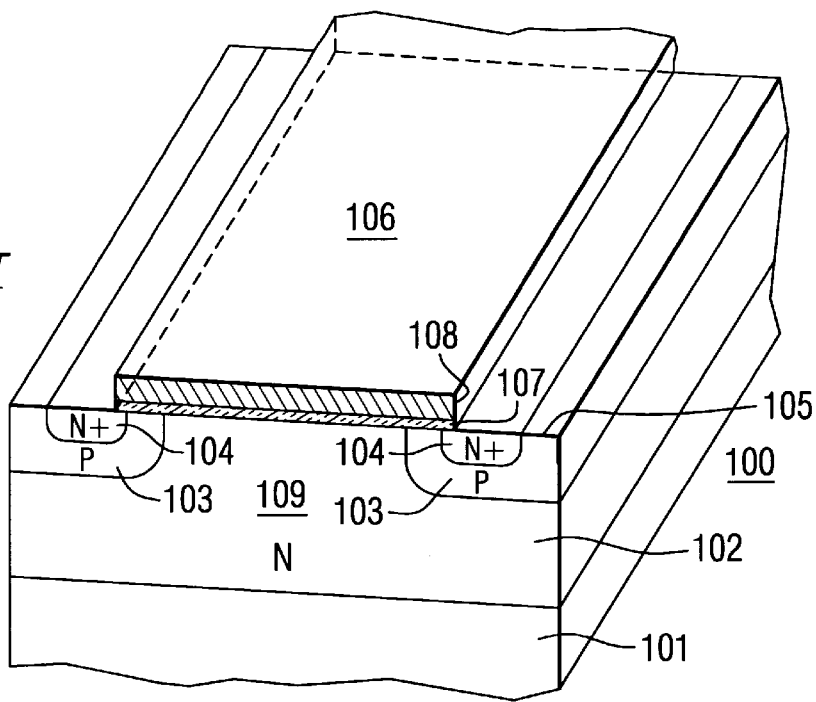
FIG. 1 is a schematic perspective view of a prior art device having a planar DMOS configuration.
Figure 2:
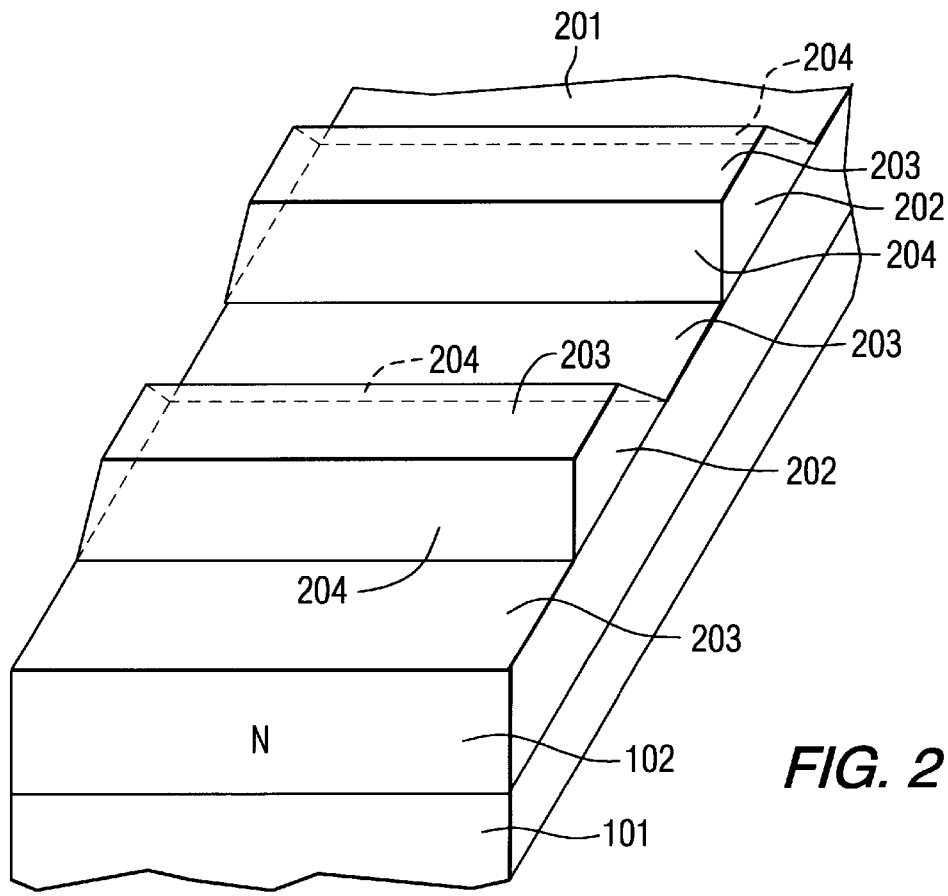
FIG. 2 is a schematic perspective view depicting a corrugated etched upper surface of a semiconductor wafer.

A corrugated silicon surface topography such as that depicted in FIG. 2 increases the surface area available to a channel. Substrate 101 includes an upper layer 102 whose upper surface 201 includes parallel corrugations 202 defined by alternating planar parallel portions 203 and oblique portions 204. For a given lateral distance, the total width of surface 201 comprising alternating parallel portions 203 and oblique portions 204 exceeds that of planar surface 105 of FIG. 1.

Figure 2A:
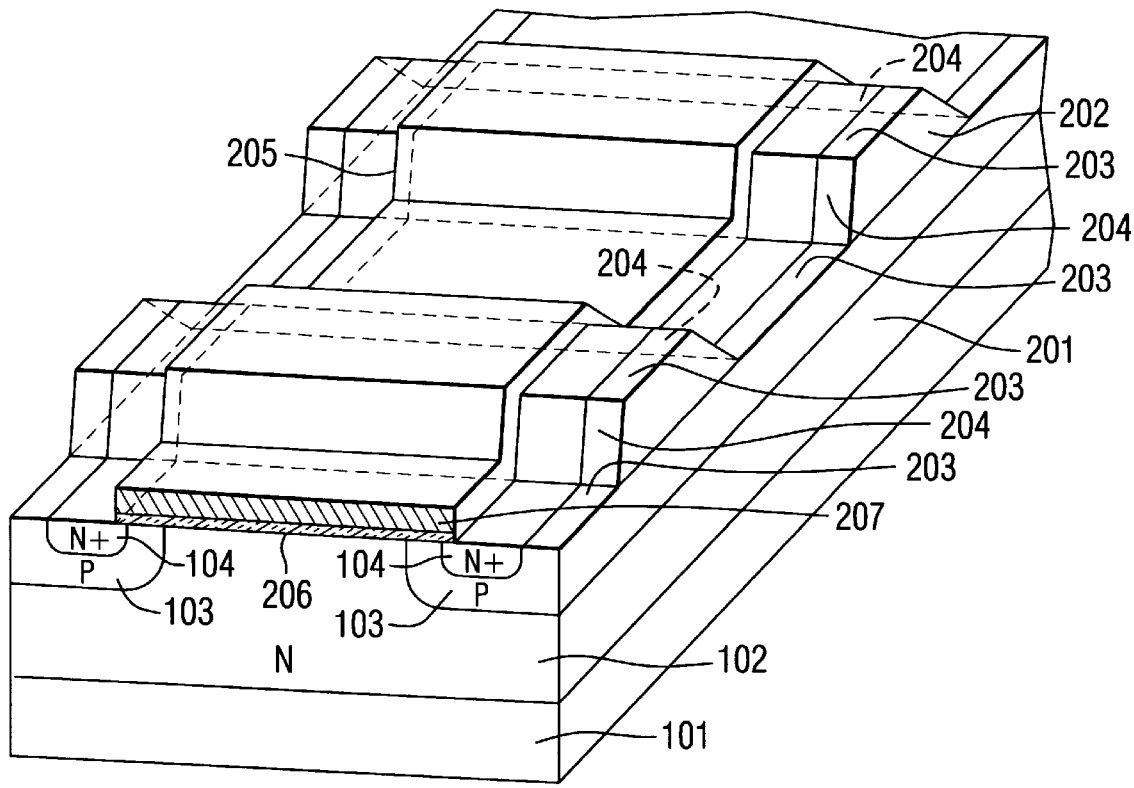
FIG. 2A is a schematic perspective view of a power DMOS device having increased channel width in accordance with the present invention.

FIG. 2A schematically depicts a device 200 of the present invention, which, like prior art device 100 of FIG. 1, is formed on a substrate 101 having a doped upper layer 102 that includes doped P-well regions 103 and heavily doped N+ source regions 104. Substrate 101 comprises a semiconductor material layer such as monocrystalline silicon, and doped upper layer 102 can be an epitaxial layer. Although upper layer 102 and source regions 104 are shown as being of N conduction type and well regions 103 as being of P conduction type, it is recognized that the conduction types can be reversed, P for N and N for P.

FIG. 2A also depicts an upper surface 201 that includes parallel corrugations 202 defined by alternating planar parallel portions 203 and oblique portions 204. A gate 205 situated between adjacent source regions 104 and comprising an insulating layer 206 and an overlying conductive layer 207 is situated on corrugated upper surface 201. Well regions 103, source regions 104, and gate layers 206 and 207 all conform to upper surface 201.

Figure 3A:
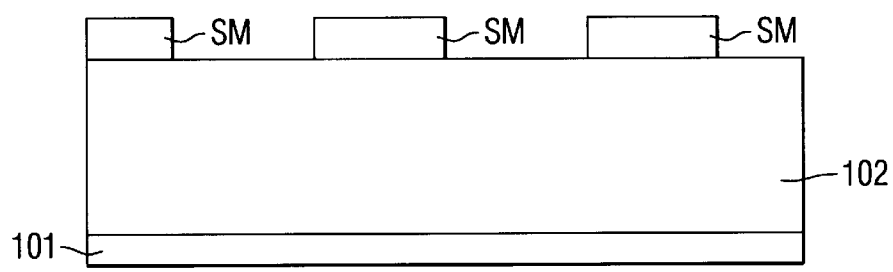
FIGS. 3A–E schematically depict steps for forming a power MOS device in accordance with the present invention.

A process for forming a power MOS device in accordance with the present invention is depicted in FIGS. 3A–E. As shown in FIG. 3A, a stripe mask SM is formed on the upper layer 102 of substrate 101. Parallel corrugations 202 defined by alternating planar parallel portions 203 and oblique portions 204 are formed by selective etching of masked upper layer 102.

The etching of layer 102 can be controlled to form corrugations 202 having a specified height h and an etch angle θ, as described in, for example, Carlile et al., "Trench Etches in Silicon with Controllable Sidewall Angles," *J. Electrochem. Soc.*: SOLID-STATE SCIENCE AND TECHNOLOGY, August 1988, pp 2058–2064, the disclosure of which is incorporated herein by reference. Anisotropic etching of silicon using various reagents such as potassium hydroxide-propanol and ethylenediamine-pyrocatechol mixtures is described in Bean, IEEE TRANSACTIONS ON ELECTRON DEVICES, 1978, Vol. ED-25, No. 10, pp 1185–1193, the disclosure of which is incorporated herein by reference.

Figure 3B:
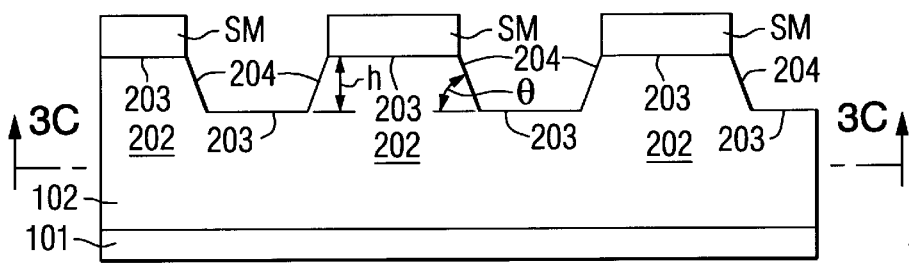
Figure 3C:
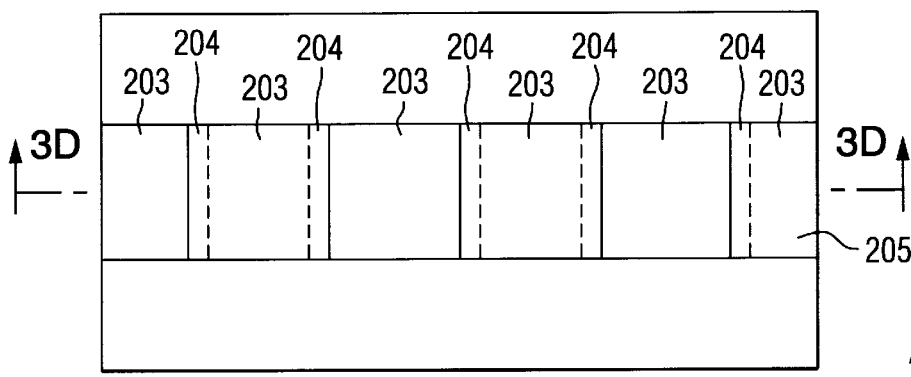
Figure 3D:
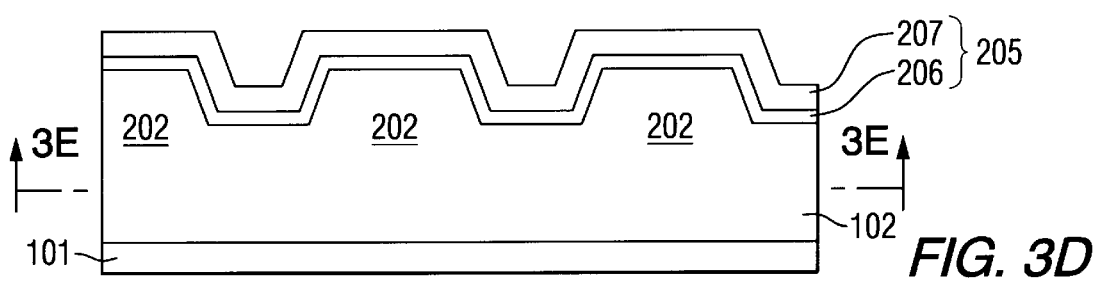

FIG. 3C is a cross-sectional view through A–A' of FIG. 3B following removal of stripe mask SM and formation on upper layer 102 of a gate 205 that is transversely oriented to corrugations 202. In FIG. 3D, which is a cross-sectional view through B–B' of FIG. 3C, is shown the insulating layer 206 and conducting layer 207 that comprise gate 205. Layers 206 and 207 both conform to corrugations 202.

Figure 3E:
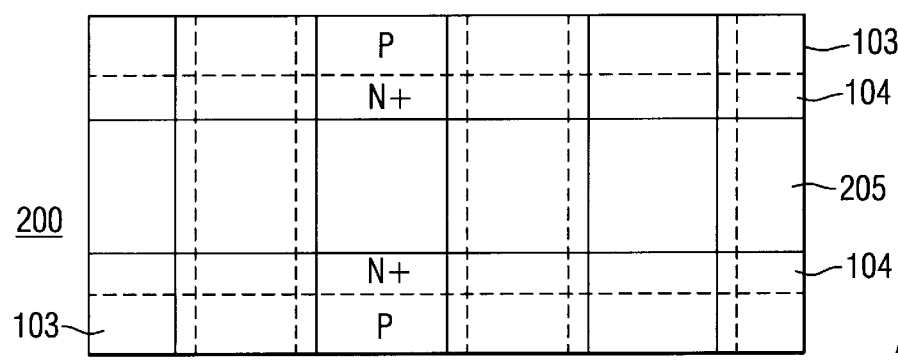

FIG. 3E is a cross-sectional view through C–C' of FIG. 3D following implantation of a dopant such as boron into upper layer 102, resulting in the formation of P-well regions 103, and the further implantation of a dopant such as arsenic or phosphorus into layer 102 adjacent to gate 205 to form N+ source regions 104. It is understood that variations in the sequence of process steps, for example, masking, doping, etc., as shown in FIGS. 3A-E are contemplated as being within the scope of the present invention.

Figure 4:
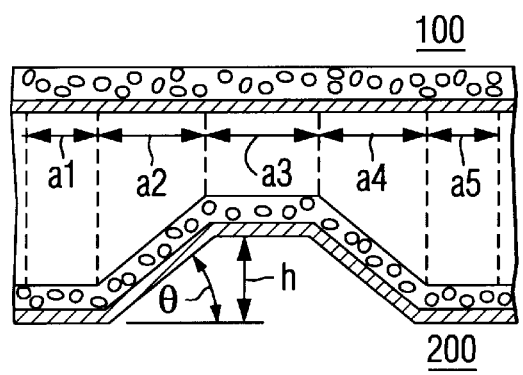
FIG. 4 is an illustration of the channel width improvement provided by a device of the present invention compared with a prior art device.

FIG. 4 illustrates the increase in channel width gained by device 200 of the present invention compared with device 100 of the prior art:

For device 100: width $w=a_1+a_2+a_3+a_4+a_5$
For device 200: width $w'=a_1+a_2/\cos\theta+a_3+a_4/\cos\theta+a_5$
For 0°<θ<90° and height hwidth $w=a_1+2h/\tan\theta+a_3+a_5$
width $w'=a_1+2h/\sin\theta+a_3+a_5$
$w'-w=2h(1/\sin\theta-1/\tan\theta)$
For θ=45°: $(w'-w)/w=0.828(h/w)$ For θ=60°: $(w'-w)/w=1.15(h/w)$ As FIG. 4 shows, the increase in channel width for device 200 relative to device 100, (w'-w)/w, depends on the height/ width ratio (h/w) of the corrugation and the acute etch angle θ, as measured between the flat and oblique portions of the corrugation. For a given height h and $a_1=a_2=a_3=a_4=a_5$, an etch angle θ of 45° results in an increase of about 17% in the channel width for device 200 compared to device 100. If the etch angle θ is increased to 60°, the other conditions remaining constant, there is an even greater improvement in channel width, an approximately 40% increase. The increase in channel width is accompanied by a corresponding decrease in on-resistance. These benefits of the present invention are applicable to both horizontal and vertical channel MOSFETs.

Figure 5:
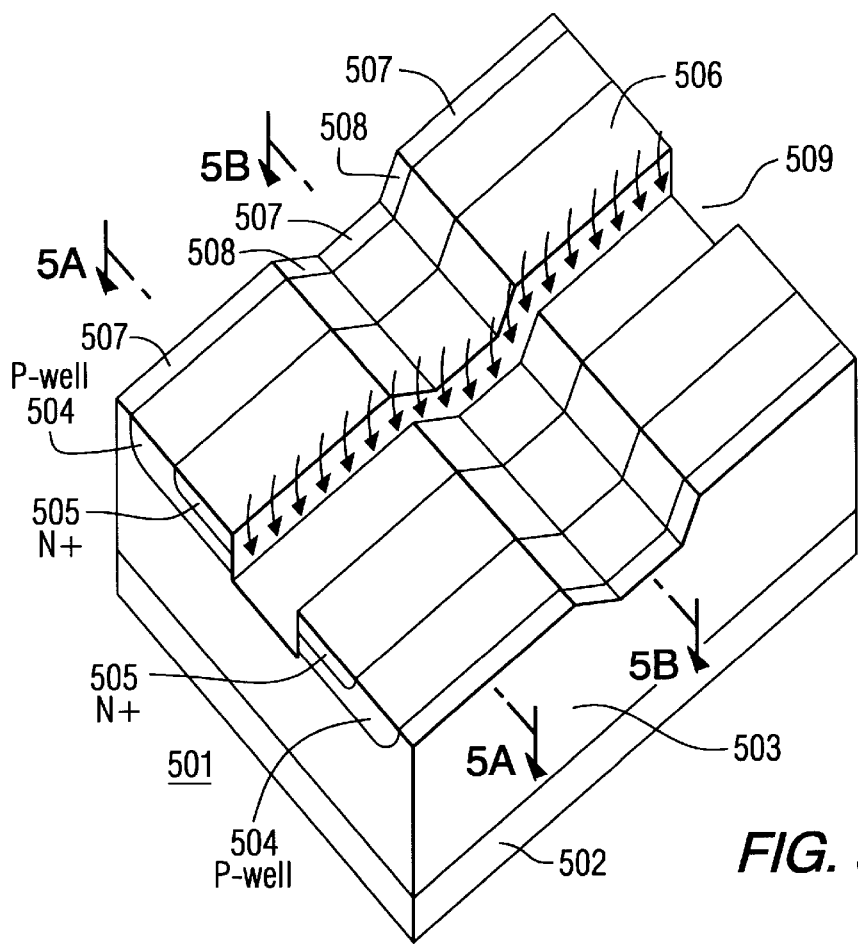
FIG. 5 is a schematic perspective view of a semiconductor wafer having a corrugated upper surface and a gate trench for forming a trench-gated power MOS device in accordance with the present invention.

FIG. 5 schematically depicts a semiconductor wafer 501 that includes a substrate 502 having a doped upper layer 503 in which are formed doped P-well regions 504 and heavily doped N+ source regions 505. Wafer upper surface 506 contains corrugations defined by alternating planar parallel portions 507 and oblique portions 508. A gate trench 509 containing corrugations corresponding to those of upper surface 506 is etched into surface 506.

Figure 5A:
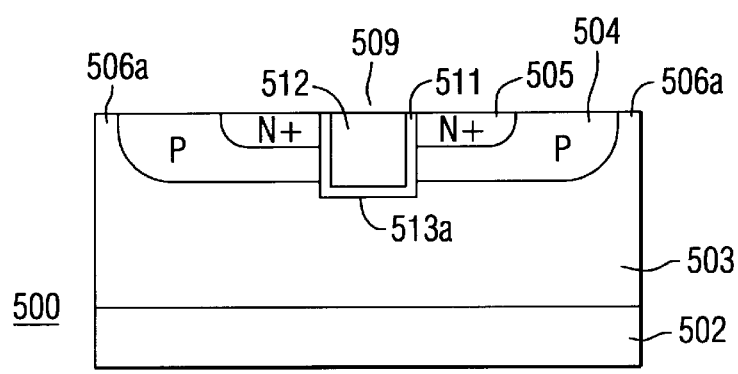
FIGS. 5A and 5B are cross-sectional views of a trench-gated device formed in the wafer depicted in FIG. 5.
Figure 5B:
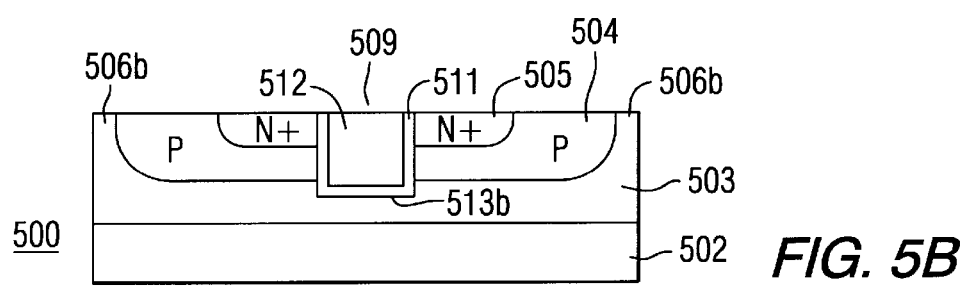

FIGS. 5A and 5B are cross-sections through lines A–A' and B–B', respectively, of FIG. 5 of a trench-gated MOSFET 500 of the present invention. In addition to the features depicted in FIG. 5, device 500 of FIGS. 5A–B depict an insulating layer 511 lining gate trench 509, which is substantially filled with a conductive material 512. FIGS. 5A–B also show the variations in height of parallel portions 506a and 506b of corrugated surface 506 as well as the variations in depth of corresponding portions 513a and 513b of the floor of trench 509.

The present invention can be applied to a variety of gate-controlled power devices, including, for example, power MOSFETs, insulated gate bipolar transistors (IGBTs), MOS-controlled thyristors (MCTs), and accumulation FETs.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. A power MOS device having increased channel width comprising:

a semiconductor substrate;
a doped upper layer of a first conduction type disposed on said substrate, said upper layer comprising a plurality of doped well regions of a second, opposite conduction type and a plurality of heavily doped source regions of said first conduction type disposed at an etched upper surface of said upper layer, said etched upper surface comprising a plurality of parallel corrugations disposed transversely to said source regions, said parallel corrugations comprising alternating planar surfaces that are parallel to one another and oblique surfaces that are of opposing inclination to one another; and
a gate separating one source region from an adjacent second source region and comprising an insulating layer and a layer of conductive material, said layers each comprising alternating planar portions that are parallel to one another and oblique portions that are of opposing inclination to one another;
whereby said corrugations provide an increase in width of a channel underlying said well, source, and gate regions.

2. The power MOS device of claim 1 wherein said first conduction type is N and said second conduction type is P.

3. The power MOS device of claim 1 wherein said gate is disposed on said etched upper surface and comprises a layer of conductive material separated from said upper surface by an insulating layer, said conductive material and insulating layers conforming to said upper surface.

4. The power MOS device of claim 1 wherein said gate comprises a gate trench extending into said upper layer, said trench having a floor and sidewalls lined with said insulating layer and being substantially filled with said conductive material, said trench floor comprising parallel corrugations that are disposed transversely to said source regions and substantially correspond to said corrugations in said upper surface.

5. The power MOS device of claim 1 wherein said substrate comprises monocrystalline silicon.

6. The power MOS device of claim 1 wherein said conductive material comprises highly doped polysilicon and said insulating layer comprises silicon dioxide.

7. The power MOS device of claim 1 wherein said plurality of source regions are in a parallel stripe configuration.

8. The power device of claim 1 selected from the group consisting of a power MOSFET, an insulated gate bipolar transistor, an MOS-controlled thyristor, and an accumulation FET.

9. The power MOS device of claim 1 wherein one of said oblique surfaces of said corrugations forms a selected acute angle with one of said parallel planar surfaces of said corrugations.

10. The power MOS device of claim 9 wherein said selected acute angle comprises from 45° to 60°.

* * * * *